(12) United States Patent
Shih

(10) Patent No.: US 11,290,309 B2
(45) Date of Patent: Mar. 29, 2022

(54) RECEIVER AND INTERNAL TCM DECODER AND ASSOCIATED DECODING METHOD

(71) Applicant: Faraday Technology Corp., Hsin-Chu (TW)

(72) Inventor: Shih-Yi Shih, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/129,799

(22) Filed: Dec. 21, 2020

(65) Prior Publication Data

US 2021/0314202 A1 Oct. 7, 2021

(30) Foreign Application Priority Data

Apr. 1, 2020 (TW) ................. 109111207

(51) Int. Cl.
*H04L 27/14* (2006.01)
*H04L 27/12* (2006.01)
(Continued)

(52) U.S. Cl.
CPC ............ *H04L 27/14* (2013.01); *H03M 13/25* (2013.01); *H04L 27/12* (2013.01); *H04L 43/0817* (2013.01); *H04L 43/50* (2013.01)

(58) Field of Classification Search
CPC ......... H04L 27/14; H04L 27/12; H04L 43/50; H04L 43/0817; H04L 25/00; H04L 25/02; H04L 25/03; H04L 25/03006; H04L 25/03178; H04L 25/03203; H04L 25/0321; H04L 25/03216–03248; H04L 1/006; H03M 13/25; H03M 13/256; H03M 13/258; H03M 13/41; H03M 13/4138–4153; H03M 13/4169–4176; H03M 13/4192

See application file for complete search history.

(56) References Cited

U.S. PATENT DOCUMENTS 4,777,636 A * 10/1988 Yamashita ............ H03M 13/41
714/795
4,823,346 A * 4/1989 Kobayashi .......... H04L 27/3438
714/794

(Continued)

FOREIGN PATENT DOCUMENTS

JP 5476838 4/2014

*Primary Examiner* — James M Perez
(74) *Attorney, Agent, or Firm* — Winston Hsu

(57) ABSTRACT

The present invention discloses a Trellis-Coded-Modulation (TCM) decoder applied in a receiver, wherein the TCM decoder includes a branch metric unit, a path metric unit, a trace-back length selection circuit and a survival path management circuit. In operations of the TCM decoder, the branch metric unit is configured to receive multiple input codes to generate multiple sets of branch information. The path metric unit is configured to calculate multiple survival paths according to the multiple sets of branch information. The trace-back length selection circuit is configured to select a trace-back length, wherein the trace-back length is determined according to a signal quality of the receiver. The survival path management circuit is configured to return the multiple survival paths for the trace-back length in order to generate an output code.

6 Claims, 4 Drawing Sheets

(51) Int. Cl.
  *H03M 13/25* (2006.01)
  *H04L 43/50* (2022.01)
  *H04L 43/0817* (2022.01)

(56) References Cited

U.S. PATENT DOCUMENTS

| | | | | |
|---|---|---|---|---|
| 5,150,369 | A * | 9/1992 | Costa | H03M 13/41 |
| | | | | 714/796 |
| 5,490,178 | A * | 2/1996 | Blaker | H03M 13/6331 |
| | | | | 714/795 |
| 5,537,445 | A * | 7/1996 | Blaker | H03M 13/6331 |
| | | | | 714/792 |
| 5,991,341 | A * | 11/1999 | Shin | H04L 1/0054 |
| | | | | 348/608 |
| 6,035,428 | A * | 3/2000 | Jekal | H03M 13/253 |
| | | | | 714/792 |
| 6,041,433 | A * | 3/2000 | Kamada | H03M 13/4169 |
| | | | | 714/795 |
| 6,263,473 | B1 * | 7/2001 | Kamada | H03M 13/6502 |
| | | | | 714/795 |
| 6,327,317 | B1 * | 12/2001 | Chennakeshu | H04L 25/03178 |
| | | | | 714/795 |
| 6,452,985 | B1 * | 9/2002 | Hatakeyama | H03M 13/4123 |
| | | | | 714/795 |
| 6,487,694 | B1 * | 11/2002 | Bajwa | H03M 13/4146 |
| | | | | 714/795 |
| 6,591,395 | B1 * | 7/2003 | Tsai | H03M 13/6505 |
| | | | | 714/795 |
| 6,601,215 | B1 * | 7/2003 | Thurnhofer | H03M 13/6502 |
| | | | | 714/795 |
| 6,654,929 | B1 * | 11/2003 | Kamada | H03M 13/6502 |
| | | | | 714/795 |
| 6,690,750 | B1 * | 2/2004 | Hocevar | H03M 13/4169 |
| | | | | 714/795 |
| 6,697,442 | B1 * | 2/2004 | Todoroki | H03M 13/4107 |
| | | | | 714/795 |
| 6,788,750 | B1 * | 9/2004 | Reuven | H03M 13/256 |
| | | | | 714/795 |
| 6,999,521 | B1 * | 2/2006 | Azadet | H04L 25/03197 |
| | | | | 714/795 |
| 7,035,356 | B1 * | 4/2006 | Langhammer | H03M 13/4169 |
| | | | | 714/45 |
| 7,173,985 | B1 * | 2/2007 | Diaz-Manero | H03M 13/41 |
| | | | | 714/795 |
| 7,331,013 | B2 * | 2/2008 | Rudosky | H03M 13/4169 |
| | | | | 714/795 |
| 7,404,139 | B2 * | 7/2008 | Prasad | H03M 13/3961 |
| | | | | 714/796 |
| 7,561,641 | B2 * | 7/2009 | Kuo | H04L 1/0054 |
| | | | | 375/341 |
| 7,564,930 | B1 * | 7/2009 | Diaz-Manero | H03M 13/6561 |
| | | | | 714/795 |
| 7,861,146 | B2 * | 12/2010 | Watanabe | H03M 13/4176 |
| | | | | 714/795 |
| 8,301,990 | B2 * | 10/2012 | Wilson | H03M 13/4169 |
| | | | | 714/795 |
| 8,891,695 | B2 * | 11/2014 | Ahmed | H04L 27/0014 |
| | | | | 375/341 |
| 10,256,845 | B1 * | 4/2019 | Yksel | H03M 13/4184 |
| 11,165,446 | B1 * | 11/2021 | Quitzk | H03M 13/256 |
| 2001/0007142 | A1 * | 7/2001 | Hocevar | H03M 13/4107 |
| | | | | 714/795 |
| 2002/0112211 | A1 * | 8/2002 | Brick | H03M 13/3961 |
| | | | | 714/795 |
| 2002/0168017 | A1 * | 11/2002 | Berthet | H03M 13/25 |
| | | | | 375/267 |
| 2004/0064781 | A1 * | 4/2004 | Kamada | H03M 13/41 |
| | | | | 714/795 |
| 2004/0243916 | A1 * | 12/2004 | Kim | H03M 13/3988 |
| | | | | 714/796 |
| 2005/0074070 | A1 * | 4/2005 | Betts | H04L 27/3427 |
| | | | | 375/265 |
| 2006/0136802 | A1 * | 6/2006 | Jeon | H03M 13/395 |
| | | | | 714/792 |
| 2006/0262832 | A1 * | 11/2006 | Kaewell | H04B 1/707 |
| | | | | 375/141 |
| 2007/0168845 | A1 * | 7/2007 | Endo | H03M 13/4169 |
| | | | | 714/795 |
| 2007/0183539 | A1 * | 8/2007 | Nishijima | H03M 13/3961 |
| | | | | 714/795 |
| 2008/0072125 | A1 * | 3/2008 | Norris | H03M 13/41 |
| | | | | 714/792 |
| 2008/0072126 | A1 * | 3/2008 | Norris | H03M 13/6513 |
| | | | | 714/792 |
| 2008/0178063 | A1 * | 7/2008 | Norris | H03M 13/6513 |
| | | | | 714/786 |
| 2009/0089649 | A1 * | 4/2009 | Wilson | H03M 13/4169 |
| | | | | 714/795 |
| 2009/0213967 | A1 * | 8/2009 | Yeh | H04L 1/0044 |
| | | | | 375/316 |
| 2010/0229076 | A1 * | 9/2010 | Shinagawa | H03M 13/6561 |
| | | | | 714/795 |
| 2012/0042229 | A1 * | 2/2012 | Tang | H03M 13/4176 |
| | | | | 714/795 |
| 2012/0210197 | A1 * | 8/2012 | Jang | H04L 1/0054 |
| | | | | 714/799 |
| 2013/0028299 | A1 * | 1/2013 | Tsai | H03M 13/4107 |
| | | | | 375/219 |
| 2013/0287147 | A1 * | 10/2013 | Ahmed | H04L 27/0014 |
| | | | | 375/324 |
| 2021/0314202 | A1 * | 10/2021 | Shih | H03M 13/4169 |

* cited by examiner

RECEIVER AND INTERNAL TCM DECODER AND ASSOCIATED DECODING METHOD

BACKGROUND OF THE INVENTION

1. Field of the Invention

The present invention is related to a Trellis-Coded-Modulation (TCM) decoder.

2. Description of the Prior Art

A Trellis-Coded-Modulation (TCM) decoder is utilized in a Gigabit Ethernet (1000BASE-T) receiver for performing error correction decoding operations. Current TCM decoders are designed to have a fixed trace-back length, i.e. a generated output code is output after returning a received input code for a fixed depth (or a fixed period length). The trace-back length or the fixed depth also directly reflects latency of the receiver in that the longer the trace-back length, the longer the latency. Furthermore, as quality of a signal received by the receiver is not regular, the trace-back length of the TCM decoder should be set to be relatively long in order to guarantee the success of operations of the TCM decoder. This, however, worsens the signal latency.

SUMMARY OF THE INVENTION

This in mind, an objective of the present invention is to provide a Trellis-Coded-Modulation decoder (TCM) and an associated decoding method, which can determined a trace-back length suitable for the TCM decoder according to a signal quality of a receiver. As the trace-back length may be automatically modified according to the signal quality of the receiver, unnecessary latency of the received signal can be reduced, which solves the problem of the related art.

In one embodiment of the present invention, a TCM decoder applied in a receiver is disclosed. The TCM decoder comprises a branch metric unit, a path metric unit, a trace-back length selection circuit and a survival path management circuit. In operations of the TCM decoder, the branch metric unit is configured to receive multiple input codes to generate multiple sets of branch information. The path metric unit is configured to calculate multiple survival paths according to the multiple sets of branch information. The trace-back length selection circuit is configured to select a trace-back length, wherein the trace-back length is determined according to a signal quality of the receiver. The survival path management circuit is configured to return the multiple survival paths for the trace-back length to generate an output code.

In another embodiment of the present invention, a decoding method for a TCM decoder is disclosed. The decoding method comprises the following steps: receiving multiple input codes to generate multiple sets of branch information; calculating multiple survival paths according to the multiple sets of branch information; selecting a trace-back length, wherein the trace-back length is determined according to a signal quality of the receiver; and returning the multiple survival paths for the trace-back length in order to generate an output code.

In another embodiment of the present invention, a receiver is disclosed. The receiver comprises a front-end circuit, an analog-to-digital converter (ADC), an equalizer and a TCM decoder. In operations of the receiver, the front-end circuit is configured to receive a network signal from a network cable. The ADC is configured to convert the network signal into a digital signal. The equalizer is configured to perform an equalization operation on the digital signal for eliminating Inter-Symbol Interference (ISI), to generate multiple input codes. The TCM decoder is configured to perform decoding operations on the multiple input codes to generate multiple output codes, wherein a trace-back length utilized by the TCM decoder is determined according to a signal quality of the network signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
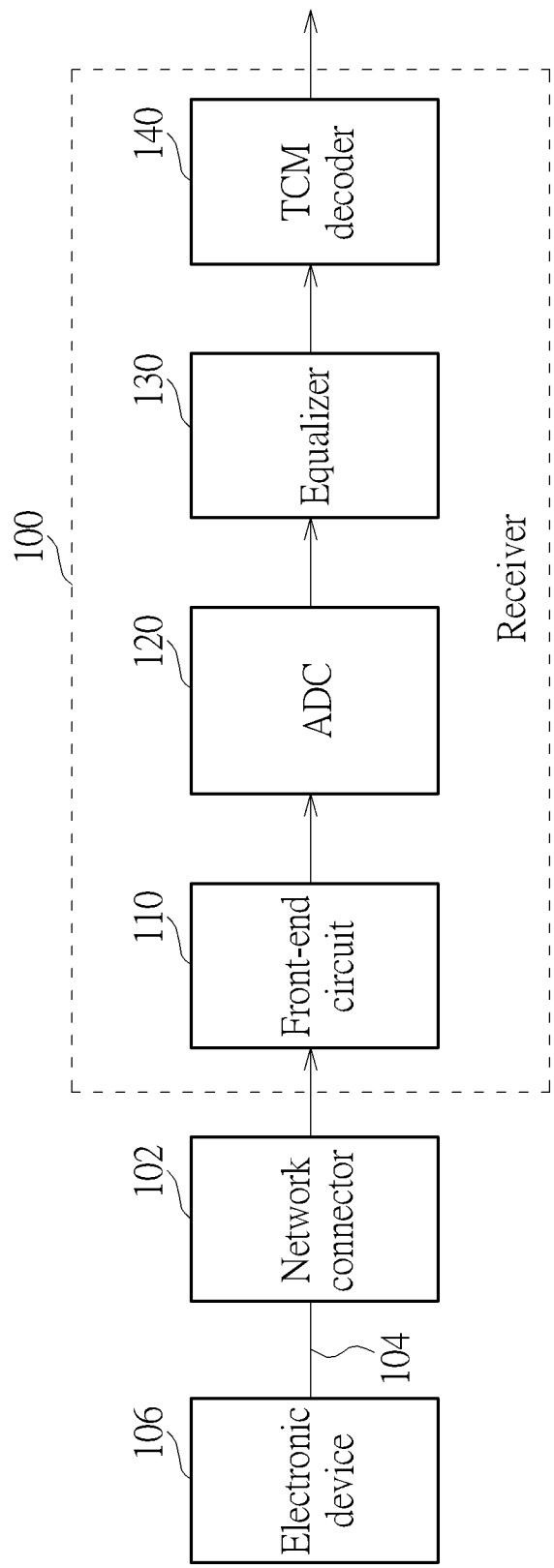
FIG. 1 is a diagram illustrating a receiver according to an embodiment of the present invention.

FIG. 1 is a diagram illustrating a receiver 100 according to an embodiment of the present invention. As shown in FIG. 1, the receiver 100 is connected to an electronic device 106 through a network connector 102 and a network cable 104, where the network connector 102 may be a network connector conforming to an 8 position 8 contact (8P8C) specification, e.g. an RJ45 connector, and the receiver 100 may be configured to receive/process Gigabit Ethernet signals. The receiver 100 may be installed in any electronic device which is equipped with network functions, and the receiver 100 comprises a front-end circuit 110, an analog-to-digital converter (ADC) 120, an equalizer 130, and a Trellis-Coded-Modulation (TCM) decoder 140 adopting a Viterbi algorithm.

In operations of the receiver 100, the front-end circuit 110 processes a network signal from the network connector 102 and transmits the signal to the ADC 120, where analog-to-digital conversion is performed to generate a digital signal. The equalizer 130 then performs an equalization operation on the digital signal for eliminating Inter-Symbol Interference (ISI), to generate multiple input codes. The TCM decoder 140 is configured to perform a decoding operation on the multiple input codes to generate multiple output codes to backend circuit(s). In the embodiment of FIG. 1, a signal quality of the network signal received by the receiver 100 may vary due to the electronic device 106 and the network cable 104, e.g. the longer the network cable 104, the worse the signal quality, and the shorter the network cable 104, the better the signal quality. Thus, in order to optimize receiving latency of the receiver 100, the TCM decoder 140 of this embodiment may automatically determine the most suitable trace-back length according to the signal quality received by the receiver 100, where the receiving latency of the receiver 100 means a transmission time from the front-end circuit 110 to an output end of the TCM decoder 140. As the TCM decoder 140 may adopt a shorter trace-back length when the signal quality of the receiver 100 is better, the receiving latency of the receiver 100 may be reduced; and a longer trace-back length may be adopted when the signal quality of the receiver 100 is worse, in order to reduce an error rate of the TCM decoder 140.

Figure 2:
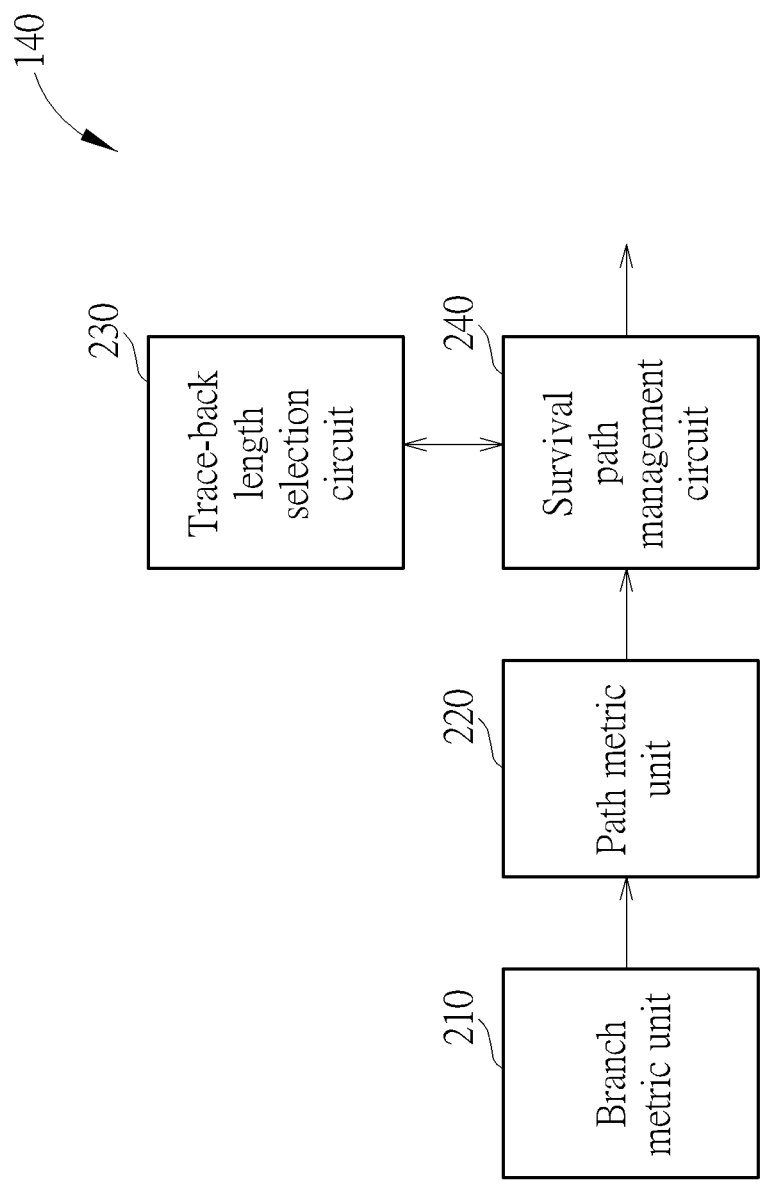
FIG. 2 is a diagram illustrating a Trellis-Coded-Modulation (TCM) decoder according to an embodiment of the present invention.
Figure 3:
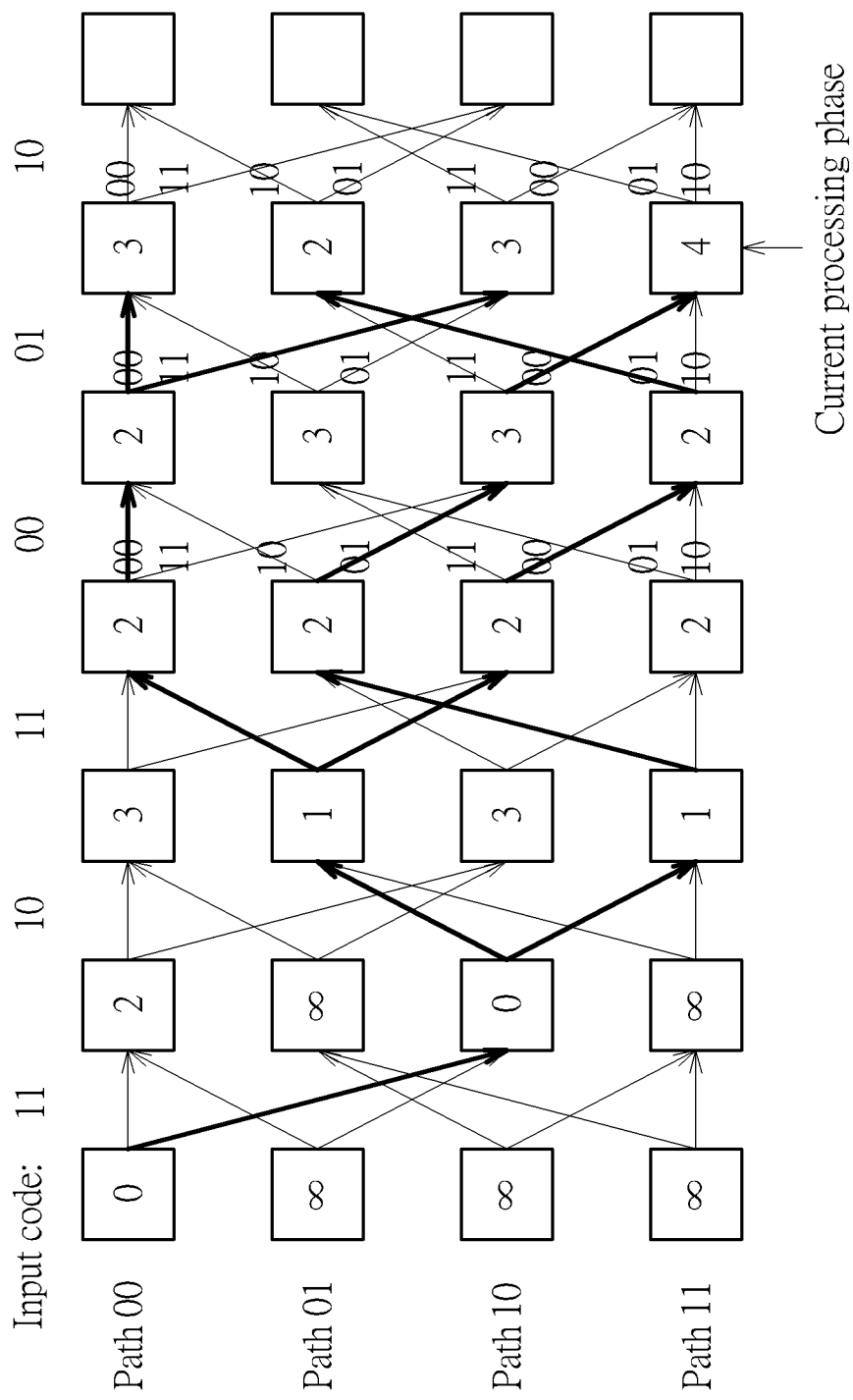
FIG. 3 is a diagram illustrating operations of determining the trace-back length.

FIG. 2 is a diagram illustrating the TCM decoder 140 according to an embodiment of the present invention. As shown in FIG. 2, the TCM decoder 140 comprises a branch metric unit 210, a path metric unit 220, a trace-back length selection circuit 230 and a survival path management circuit 240. For operations of the TCM decoder 140, when the receiver 100 and the electronic device 106 start to establish a network link (e.g. the electronic device having the receiver 100 has just been booted and performs initialization), the receiver 100 receives multiple test signals from the electronic device 106, and the equalizer 130 performs training according to the multiple test signals at this moment for parameter setting. Furthermore, the branch metric unit 210 generates multiple sets of test branch information according to multiple test input codes generated by the equalizer 130. The path metric unit 220 calculates multiple test survival paths according to the multiple sets of test branch information. The survival path management circuit 240 determines a convergence length according to the multiple test survival paths, for the trace-back length selection circuit 230 to determine a trace-back length. Refer to FIG. 3 for a detailed description, which is a diagram illustrating operations of determining the trace-back length. Assume that the input codes received by the TCM decoder 140 are "11", "10", "11", "00", "01" and "10" in sequence. A first row is a path 00, a second row is a path 01, a third row is a path 10, a fourth row is a path 11, and each block represents a state. In a portion of states in FIG. 3, corresponding test branch information (i.e. the state being directed) may be determined according to the currently received input code. Taking the first input code "11" as an example, the branch merit unit 210 determines the test branch information of the path 00 to direct to the state of the path 10 according to the input code "11"; taking the second input code "10" as an example, the branch merit unit 210 determines the test branch information of the path 10 to direct to the states of the paths 01 and 11 according to the input code "10"; and the rest may be deduced by analogy. It should be noted that the aforementioned operations related to the branch information involves complicated calculations which are well-known by those skilled in this art, and are not the focal point of the present invention. In addition, the value assigned to each state shown in FIG. 3 is required for calculations only, and is also not the focal point of the present invention. Further descriptions of these features are not repeated for brevity.

The path merit unit 220 then calculates the multiple test survival paths according to the multiple sets of test branch information, where the multiple test survival paths are illustrated by thick arrows in FIG. 3. In detail, referring to the examples shown in FIG. 3, if each state of the path 00 directs to the state of the path 00, it means the corresponding output code is "00"; if each state of the path 00 directs to the state of the path 10, this means the corresponding output code is "11"; if each state of the path 01 directs to the state of the path 00, this means the corresponding output code is "10"; if each state of the path 01 directs to the state of the path 10, this means the corresponding output code is "01"; if each state of the path 10 directs to the state of the path 01, this means the corresponding output code is "11"; if each state of the path 10 directs to the state of the path 11, this means the corresponding output code is "00"; if each state of the path 11 directs to the state of the path 01, this means the corresponding output code is "01"; and if each state of the path 11 directs to the state of the path 11, this means the corresponding output code is "10". The path merit unit 220 may return the four states of a current processing phase to obtain four survival paths, where the survival paths of the path 00 from left to right correspond to the output codes (11, 11, 10, 00, 00), the survival paths of the path 01 from left to right correspond to the output codes (11, 00, 01, 01, 00), the survival paths of the path 10 from left to right correspond to the output codes (11, 11, 10, 00, 11), and the survival paths of the path 11 from left to right correspond to the output codes (11, 00, 01, 01, 00).

As the aforementioned four survival paths may converge to a single state (i.e. from left to right, the second state of the path 10) after returning four input codes, the survival path management circuit 240 may determine the convergence length as "4" according to the aforementioned four test survival paths. It should be noted that the aforementioned steps may be repeatedly executed according to the input codes that are sequentially input; i.e. the convergence length finally determined by the survival path management 240 is determined according to the previously calculated convergence lengths, e.g. by selecting the longest within the convergence lengths.

The trace-back length selection circuit 230 may then determine the trace-back length according to the convergence length determined by the survival path management circuit 240. For example, the trace-back length may be equal to the convergence length, or the trace-back length may be slightly greater than the convergence length.

After the trace-back length selection circuit 230 determines the trace-back length, for network signals (data signals) that are subsequently received by the receiver 100, the branch merit unit 210 generates multiple sets of branch information according to the multiple input codes generated by the equalizer 130, the path merit unit 220 calculates multiple test survival paths according to the multiple sets of test branch information, and the survival path management circuit 210 returns the multiple survival paths for the trace-back length to generate an output code. Taking FIG. 3 for illustration, assuming that the trace-back length is "4", from left to right, there is the second state of the path 10 when returning the current processing phase for four input codes, and this state is directed by the state of the path 00 (i.e. corresponds to the input code "11"). Thus, when the TCM decoder 140 finishes processing of the fifth input code "01", an output code "11" corresponding to the first input code "11" may be generated to backend circuit(s). As mentioned above, as the survival path management circuit 240 may perform the decoding operations according to the determined trace-back length, the receiving latency can be reduced as much as possible under a condition of successful decoding.

Taking FIG. 3 again as an example for further illustration, four survival paths may converge to a single state (i.e. from left to right, the second state of the path 10) after returning for four input codes, and if further returning leftwards (i.e. increasing the trace-back length), only a single state and the same input code may be obtained. Thus, the method of determining the trace-back length according to the signal quality as illustrated in the embodiment mentioned above can reduce unnecessary returning calculations, thereby reducing the receiving latency of the receiver 100.

It should be noted that the focal point of the present invention is automatically determining the trace-back length in the TCM decoder 140 according to the signal quality, rather than the states and the content being directed in the TCM decoder 140. The content illustrated in FIG. 3 is merely an example to aid understanding of the concept of determining the trace-back length illustrated in this embodiment, and is not meant to be a limitation of the present invention.

In this embodiment, the TCM decoder 140 may determine the trace-back length for subsequent usage only when the receiver 100 establishes a network link with the electronic device 106, i.e. the TCM decoder 100 will not determine a new trace-back length again during the process of the receiver 100 receiving data signals. In another embodiment, when the receiver 100 is in an idle state, the TCM decoder 140 may also receive other signals from the electronic device 106 to determine a new trace-back length.

Figure 4:
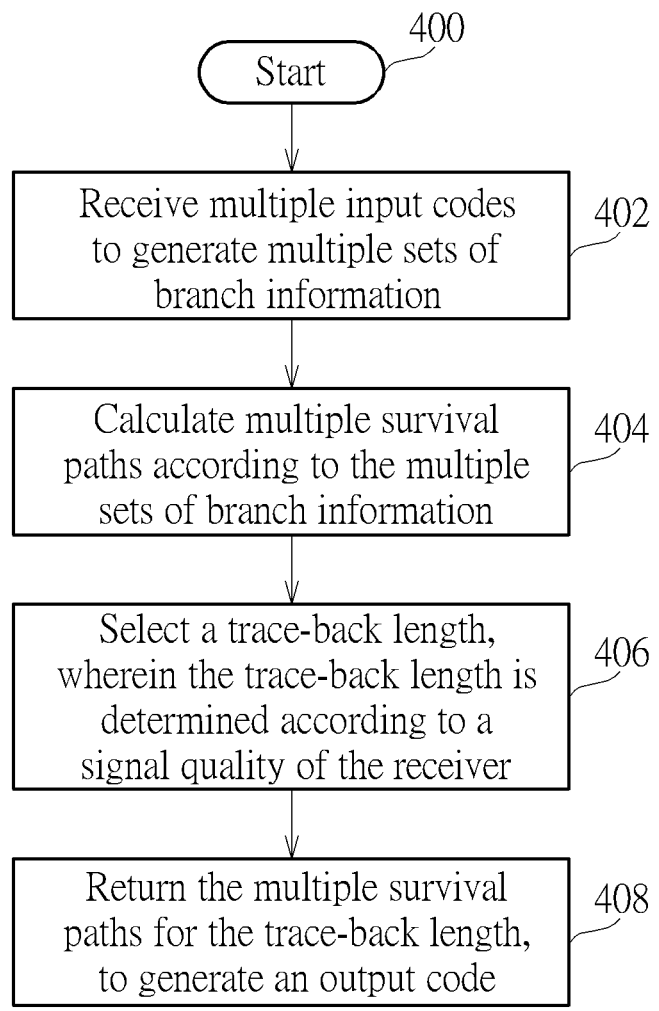
FIG. 4 is a flowchart illustrating a decoding method for a TCM decoder according to an embodiment of the present invention.

FIG. 4 is a flowchart illustrating a decoding method for a TCM decoder according to an embodiment of the present invention. Referring to the above embodiment, the flow of FIG. 4 is shown as follows.

Step 400: the flow starts.

Step 402: receive multiple input codes to generate multiple sets of branch information.

Step 404: calculate multiple survival paths according to the multiple sets of branch information.

Step 406: select a trace-back length, wherein the trace-back length is determined according to a signal quality of the receiver.

Step 408: return the multiple survival paths for the trace-back length, to generate an output code.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Trellis-Coded-Modulation (TCM) decoder applied in a receiver, comprising:
   a branch metric unit, configured to receive multiple input codes to generate multiple sets of branch information;
   a path metric unit, configured to calculate multiple survival paths according to the multiple sets of branch information;
   a trace-back length selection circuit, configured to select a trace-back length, wherein the trace-back length is determined according to a signal quality of the receiver; and
   a survival path management circuit, configured to return the multiple survival paths for the trace-back length in order to generate an output code;
   wherein the receiver is configured to receive a network signal from a network cable, and the trace-back length selection circuit determines the trace-back length according to the signal quality of the network signal;
   wherein when the receiver is linked with an electronic device through the network cable, the trace-back length selection circuit determines the trace-back length according to the signal quality of multiple test signals transmitted by the electronic device.

2. The TCM decoder of claim 1, wherein when the receiver is linked with the electronic device through the network cable, the branch metric unit generates multiple sets of test branch information according to multiple test input codes generated from the multiple test signals, the path metric unit calculates multiple test survival paths according to the multiple sets of test branch information, and the survival path management circuit determines a convergence length of the multiple test survival paths according to the multiple test survival paths, for determining the trace-back length.

3. The TCM decoder of claim 1, wherein the receiver supports a Gigabit Ethernet.

4. A decoding method for a Trellis-Coded-Modulation (TCM) decoder, comprising:
   receiving multiple input codes to generate multiple sets of branch information;
   calculating multiple survival paths according to the multiple sets of branch information;
   selecting a trace-back length, wherein the trace-back length is determined according to a signal quality of the receiver; and
   returning the multiple survival paths for the trace-back length to generate an output code;
   wherein the TCM decoder is positioned in a receiver, and the step of selecting the trace-back length comprises:
      determining the trace-back length according to the signal quality of a network signal from a network cable;
   wherein the network signal comprises multiple test signals transmitted to the receiver from an electronic device when the receiver is linked with the electronic device through the network cable.

5. The decoding method of claim 4, wherein the step of selecting the trace-back length comprises:
   when the receiver is linked with the electronic device through the network cable:
      generating multiple sets of test branch information according to multiple test input codes generated from the multiple test signals;
      calculating multiple test survival paths according to the multiple sets of test branch information; and
      determining a convergence length of the multiple test survival paths according to the multiple test survival paths, for determining the trace-back length.

6. A receiver, comprising:
   a front-end circuit, configured to receive a network signal from a network cable;
   an analog-to-digital converter (ADC), configured to convert the network signal into a digital signal;
   an equalizer, configured to perform an equalization operation on the digital signal for eliminating Inter-Symbol Interference (ISI), to generate multiple input codes; and
   a Trellis-Coded-Modulation (TCM) decoder, configured to perform decoding operations on the multiple input codes to generate multiple output codes, wherein a trace-back length utilized by the TCM decoder is determined according to a signal quality of the network signal;
   wherein the TCM decoder comprises:
      a branch metric unit, configured to receive the multiple input codes to generate multiple sets of branch information;
      a path metric unit, configured to calculate multiple survival paths according to the multiple sets of branch information;
      a trace-back length selection circuit, configured to select the trace-back length, wherein the trace-back length is determined according to the signal quality of the network signal; and
      a survival path management circuit, configured to return the multiple survival paths for the trace-back length in order to generate an output code of the multiple output codes;
   wherein when the receiver establishes a link with an electronic device through the network cable, the receiver receives multiple test signals from the electronic device for the equalizer to perform parameter setting, the branch metric unit generates multiple sets of test branch information according to multiple test input codes generated from the multiple test signals, the path metric unit calculates multiple test survival paths according to the multiple sets of test branch information, and the survival path management circuit determines a convergence length of the multiple test survival paths according to the multiple test survival paths, for determining the trace-back length.

\* \* \* \* \*